United States Patent
Bango et al.

(10) Patent No.: US 9,970,975 B2
(45) Date of Patent: May 15, 2018

(54) SYSTEM FOR THE STANDOFF DETECTION OF POWER LINE HAZARDS

(71) Applicants: Joseph J. Bango, New Haven, CT (US); Michael Dziekan, Bethany, CT (US)

(72) Inventors: Joseph J. Bango, New Haven, CT (US); Michael Dziekan, Bethany, CT (US)

(73) Assignee: CONNECTICUT ANALYTICAL CORP., Bethany, CT (US)

( * ) Notice: Subject to any disclaimer, the term of this patent is extended or adjusted under 35 U.S.C. 154(b) by 0 days. days.

(21) Appl. No.: 14/756,193

(22) Filed: Aug. 14, 2015

(65) Prior Publication Data
US 2017/0045571 A1 Feb. 16, 2017

Related U.S. Application Data

(60) Provisional application No. 62/070,105, filed on Aug. 14, 2014.

(51) Int. Cl.
*G01R 31/08* (2006.01)
*G08B 21/02* (2006.01)
*G08B 21/18* (2006.01)

(52) U.S. Cl.
CPC .......... *G01R 31/085* (2013.01); *G08B 21/02* (2013.01); *G08B 21/18* (2013.01)

(58) Field of Classification Search
CPC ....... G01R 31/085; G08B 21/02; G08B 21/18
USPC ....................................................... 340/635
See application file for complete search history.

(56) References Cited

U.S. PATENT DOCUMENTS

| 4,801,937 A * | 1/1989 | Fernandes | G01R 15/142 323/357 |
| 7,940,506 B2 * | 5/2011 | Lewis | H02H 9/005 361/94 |
| 2016/0209454 A1 | 7/2016 | MacCammon et al. | |

* cited by examiner

*Primary Examiner* — Nader Bolourchi
(74) *Attorney, Agent, or Firm* — James F. Kirk

(57) ABSTRACT

The disclosed invention mitigates unnecessary electric utility and first responder intervention in the event of a downed electrical cable that may not present a voltage hazard. The disclosed downed power line status indicator invention serves to protect the public while increasing the ability to repair lines damaged due to an unplanned natural calamity or other incident. In the preferred embodiment, the invention can capture the status of a downed line and if it is energized, provide a local visual arid audible alarm of hazardous conditions to anyone in the vicinity of the downed line. In addition, the invention can generate a message or notification sent to the utility's operations center.

8 Claims, 5 Drawing Sheets

SYSTEM FOR THE STANDOFF DETECTION OF POWER LINE HAZARDS

REFERENCE TO OTHER APPLICATIONS

This application claims priority from Provisional Patent Application 62/070,105, filed on Aug. 14, 2014 and incorporates the contents of that application into this application by reference in its entirety.

FIELD OF THE INVENTION

This invention relates to the Field of systems for the Standoff Detection of Power Line Hazards and for systems that send a signal to a responsible repair center to inform the center of the location of the defect in the line.

BACKGROUND

A first objective of the present invention is to solve the problem of providing a signal to a responsible repair center that will characterize the type of cable or power line that is down to enable the to a responsible repair center to accurately evaluate the defect and determine what repair service is necessary, if any. The first object of the present invention is to reduce or eliminate unnecessary electric utility and first responder intervention in the event of a downed electrical cable that may not present a voltage hazard. Utilities are besieged by calls of downed wires, which may in fact be only telephone, cable TV, or other non-hazardous electrical or even fiber optic lines. Nevertheless, power utilities must consider all downed lines as live electrical carriers. Responding as such taxes a utilities ability to effect rapid overall system damage assessment and prolongs system restoration.

It is a second object of the invention to provide a downed line status indicator that will help the public near the defect to avoid danger and assist the responsible repair center in analyzing the defect so as to increase the ability of the responsible repair center to repair lines damaged due to an unplanned natural calamity or other incident. The status indicator includes the use of a short array of color coded light emitting diodes (LEDs) that would alert the public with a light source and inform the public of the status and mode of the downed line.

If the downed line is not energized, the disclosed invention provides a status both to the utility and to anyone in the vicinity of the fact that the line is not energized.

A third objective of the invention disclosed is to provide a warning as to a whether a power line is live, whether this represents high voltage before a distribution transformer, or line voltage from a distribution transformer.

It is a fourth objective of the invention to provide for detection of a fallen power line and to provide signal or signals that indicate if the power line is experiencing a load due to arcing or a corona. In other words, current detection is not enough; the presence of an electric field with the capability to pass current is detected.

Earlier art has shown the loss of load or a change in the line voltage to indicate a possible problem on the line

RELATED ART

A prior Department of Homeland Security revealed the need for a power line status solution. Downed power lines exhibit many well-known characteristics. There is a significant change in the areas magnetic field or B field, depending on the potential difference between the line and the ground, there may be some corona or arcing. If there is corona or arcing, there will be current consumption and therefore a change in the thermal signature of the line with respect to the surroundings. Arcing/corona produce ozone, RF interference, ultraviolet, and ultrasonic emissions. Ambient conditions can accentuate or mitigate many of these effects, depending for example if the weather is dry or humid. The magnitude of the electrical potential determines whether many characteristic downed line signatures are present as well. A 120 VAC leg from a distribution transformer is less likely to arc than a 14.4 kV feeder to the distribution transformer. On the utility side, a downed line or lines may represent an unbalanced load and most certainly will result in a significant change in the transmission line reactance and power factor characteristics in contrast to the moment before the line was severed. There is likely significant spikes and noise on the line that will be present as well. As a result, there have been a number of approaches in the prior art that have been used to detect the downed line.

SUMMARY OF THE INVENTION

The disclosed invention teaches a fusion of technologies which include the employment of integrated circuits that provide signals that indicate a change in spatial attitude of a sudden break or slack in an electrical transmission line, with options for detecting and reporting the presence of a magnetic field and or an electric field. Visual and audible alerts are provided so that the lay public can be alerted to a power line hazard. In addition, through the use of a Smartphone application, preferably for an iPhone or Android, power line integrity status can be safely communicated visually or via radio frequency transmission by the disclosed invention to personnel isolated from the transmission line.

Figure 1:
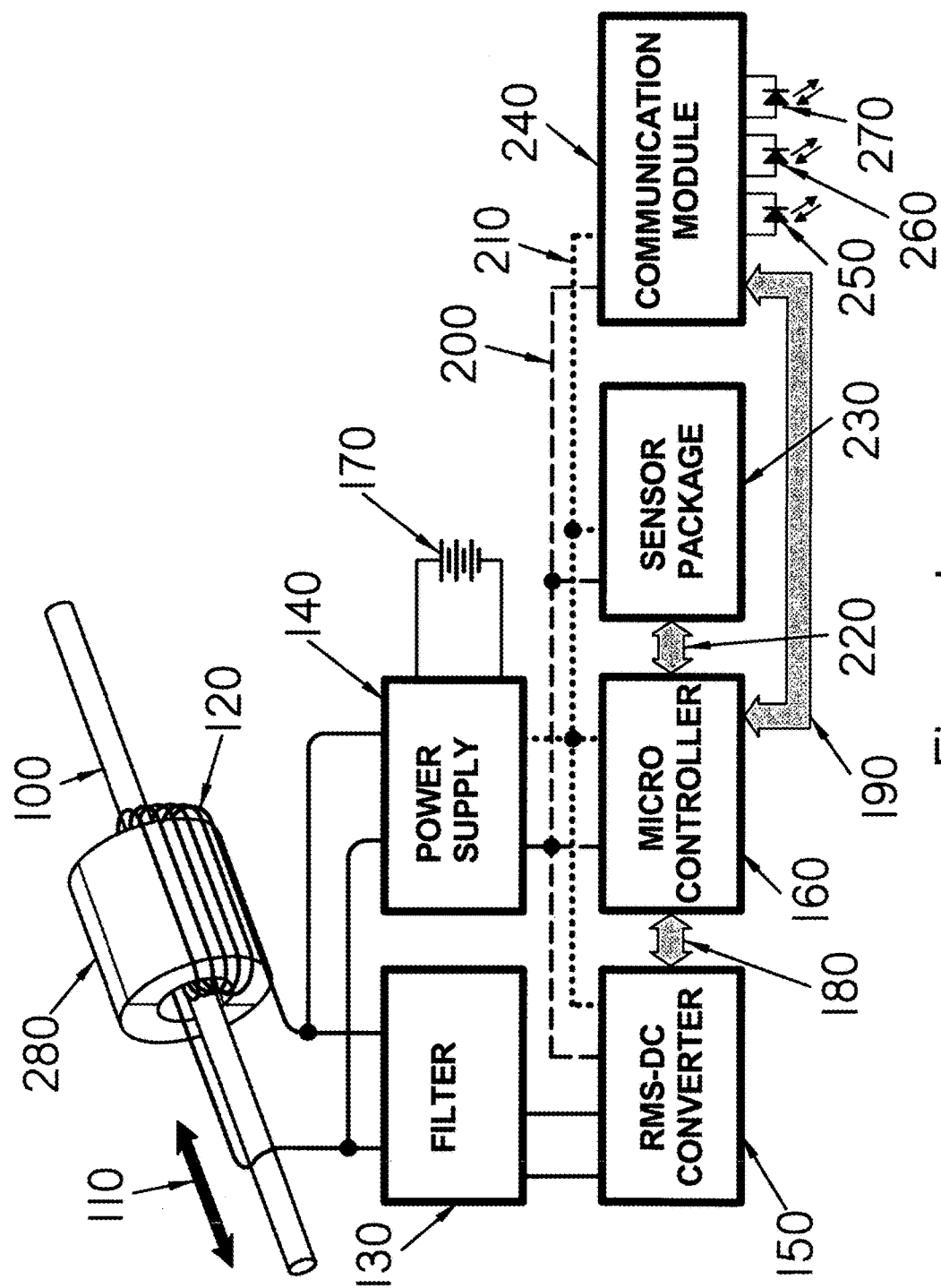
FIG. 1 is a block diagram of the preferred embodiment system, which includes a split ferrite core 280 that can be enclosed like a clamshell around a transmission line 100 through which an alternating current 110 is flowing. Inductive coil windings 120 derive both an alternating voltage signal which is filtered 130 preferably using a series resistor and a capacitor across the line. The output of the inductive coil 120 is also connected to a power supply module 140 which preferably contains a half wave or full wave diode rectifier followed by a series resistor and shunt capacitance sufficient to provide a direct current to rechargeable battery 170. The filtered electrical signal from 130 is connected to an RMS to DC converter such as an Analog Devices (Norwood, Mass.) AD536 or AD637 device. The signal from the RMS-DC Converter 150 is fed 180 into a microcontroller 160 which is programmed to look for several electrical state conditions as determined by a connection 220 to sensor package 230. The sensor package 230, RMS Converter 150, Microcontroller 160, and communication module 240 all derive operating power from connection 200 connected to the power supply 140. The sensor package 230 includes input options such as electrical field detection and angular, shock, or motion detection. In one embodiment, an accelerometer MEMS device such as the Analog Devices ADXL345, a three axis device, is capacitively coupled to a comparator circuit, such that any sudden change in spatial attitude in any axis will produce a transient alternating current signal that can be expressed through the capacitive coupling and into a comparator circuit and sampled against a predetermined reference voltage. A signal that exceeds the preset reference will be determined to indicate a sudden change in spatial orientation of a power transmission line as associated with a line break and subsequent drop of the line toward the ground. The microcontroller 160 is preferably programmed to detect the following state conditions.

1. presence of a B and E field, and no spatial change in sensor position;
2. loss of B field and presence of E field, no spatial change
3. loss of B and E field, sudden spatial change
4. loss of B field and presence of E field, sudden spatial change
5. transient loss or presence of B & E fields, spatial change, intermittent spikes
6. presence of B and E field, sudden spatial change Transient loss or presence of B & E fields, spatial change, intermittent spikes produce a signal 190 from the microcontroller 160 to be delivered to the communication module 240. The communication module contains internal logic, which activates visual LED status lamps such as preferably safe or green 250, potential hazard or yellow 260, and danger or red 270. Additional LED lamps may be added such as infrared emitting devices that can be strobed in a serial manner obvious to those skilled in the art to provide power line module status condition data derived from the microcontroller 160 and ground infrared receivers. The communication module 240 in a preferred embodiment includes an acoustic alarm, such as a piezo buzzer to warn pedestrians of a power line hazard. In addition, in the preferred embodiment, the communication module 240 is configured to provide RF communication with the power utility, cellular devices such as a smart phone, and simplex or duplex communication with other power line monitors.

The microcontroller is connected to the RMS converter 150, sensor package 230, and communication module 240 by a data bus 210.

Figure 2:
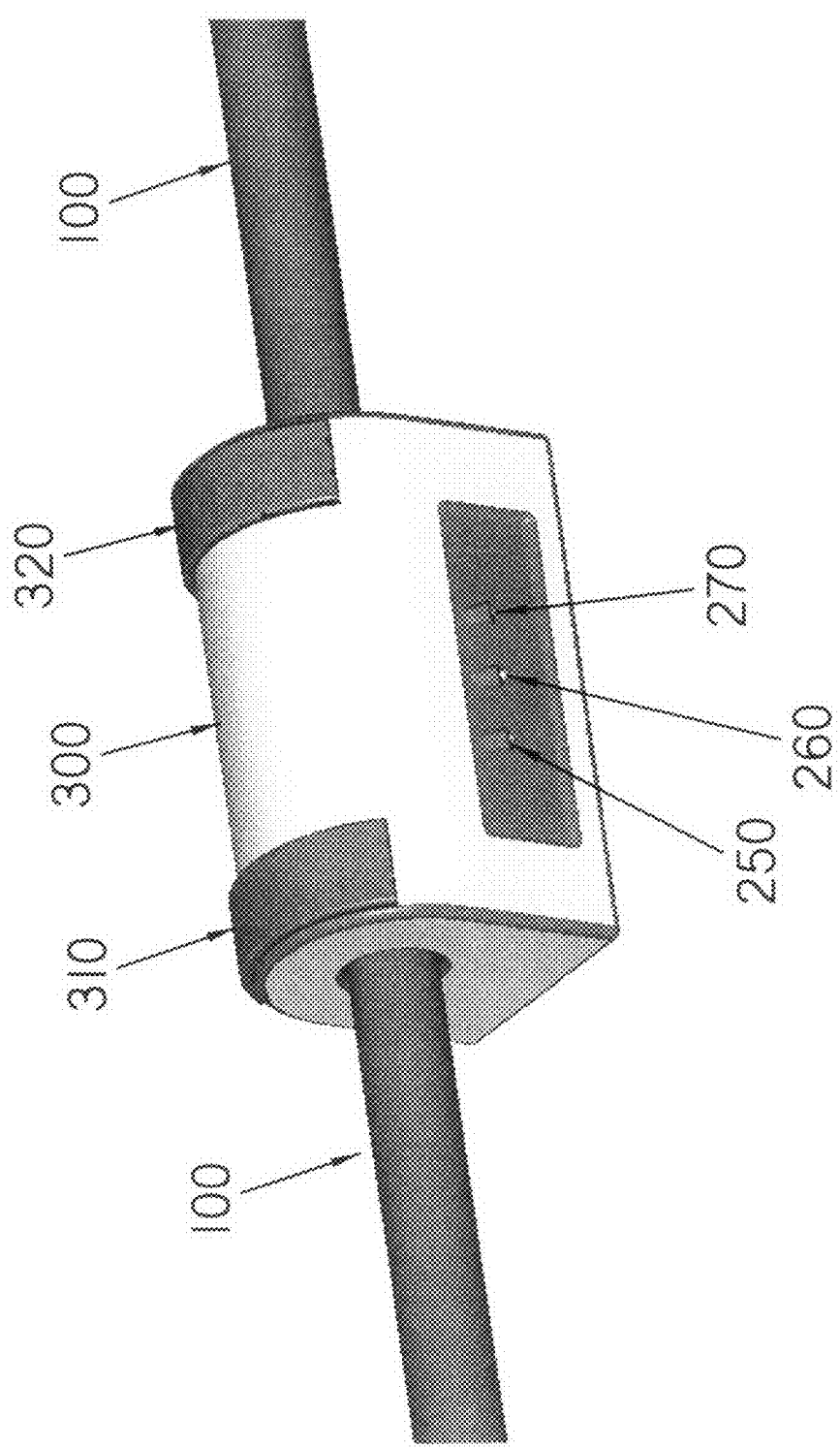

FIG. 2 is a preferred embodiment of the disclosed power transmission line monitor invention. A clamshell housing 300 encircles a power transmission line 100. The clamshell is held closed using retaining strips 310 and 320. Visual status LED lamps are located on the outside face of the monitor assembly and denoted by a green lamp 250, yellow lamp 260, and red lamp 270.

Figure 3:
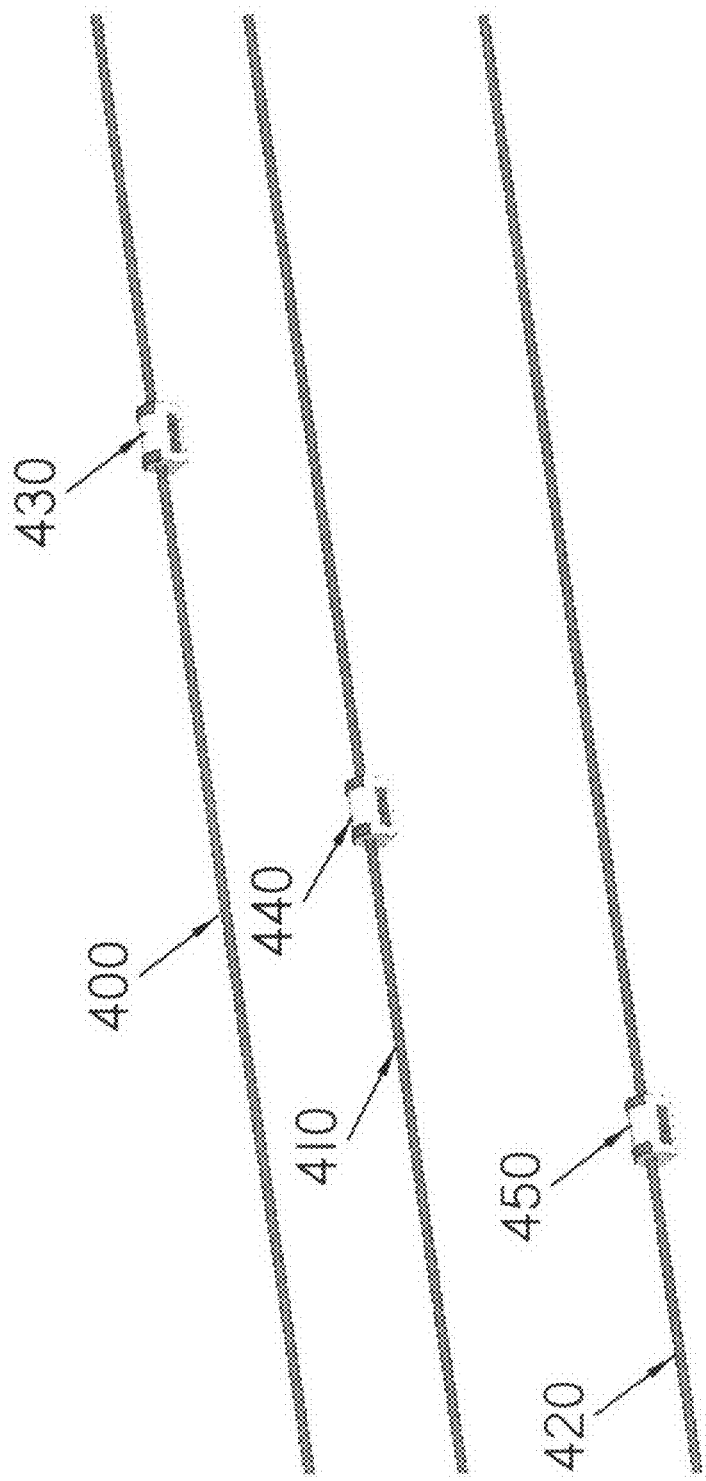

FIG. 3 is a perspective view of three parallel power line monitors 430, 440, and 450, each being equipped with a sensor used by the invention. Three phase power transmission lines are represented by 400, 410, and 420 respectively.

Figure 4:
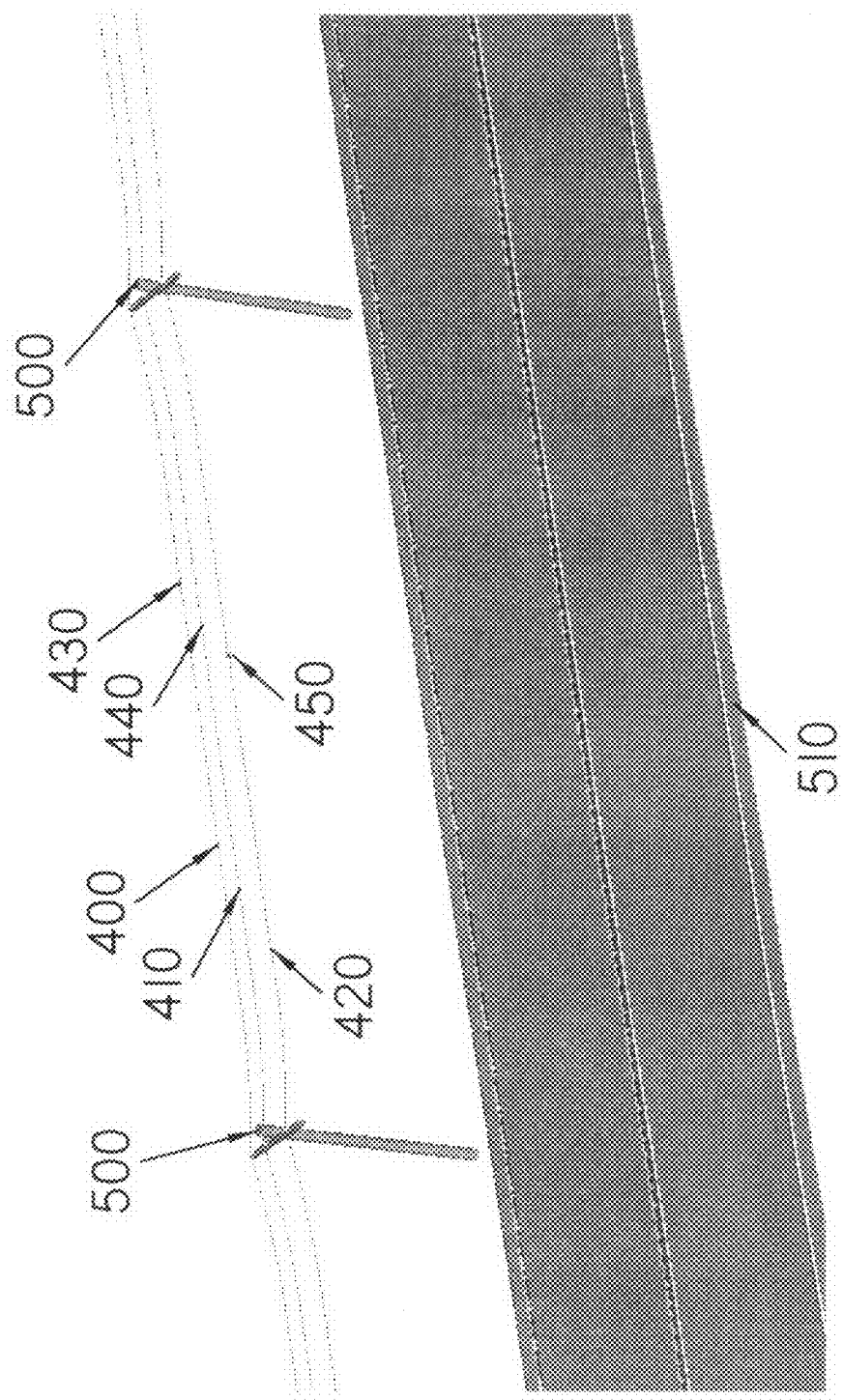

FIG. 4 is a preferred embodiment of the disclosed invention located next to a roadway 510, a typical location for power transmission lines 400, 410, and 420. The transmission lines are supported by poles 500. Line monitors 430, 440, and 450 are preferably staggered with respect to one another along the transmission line.

Figure 5:
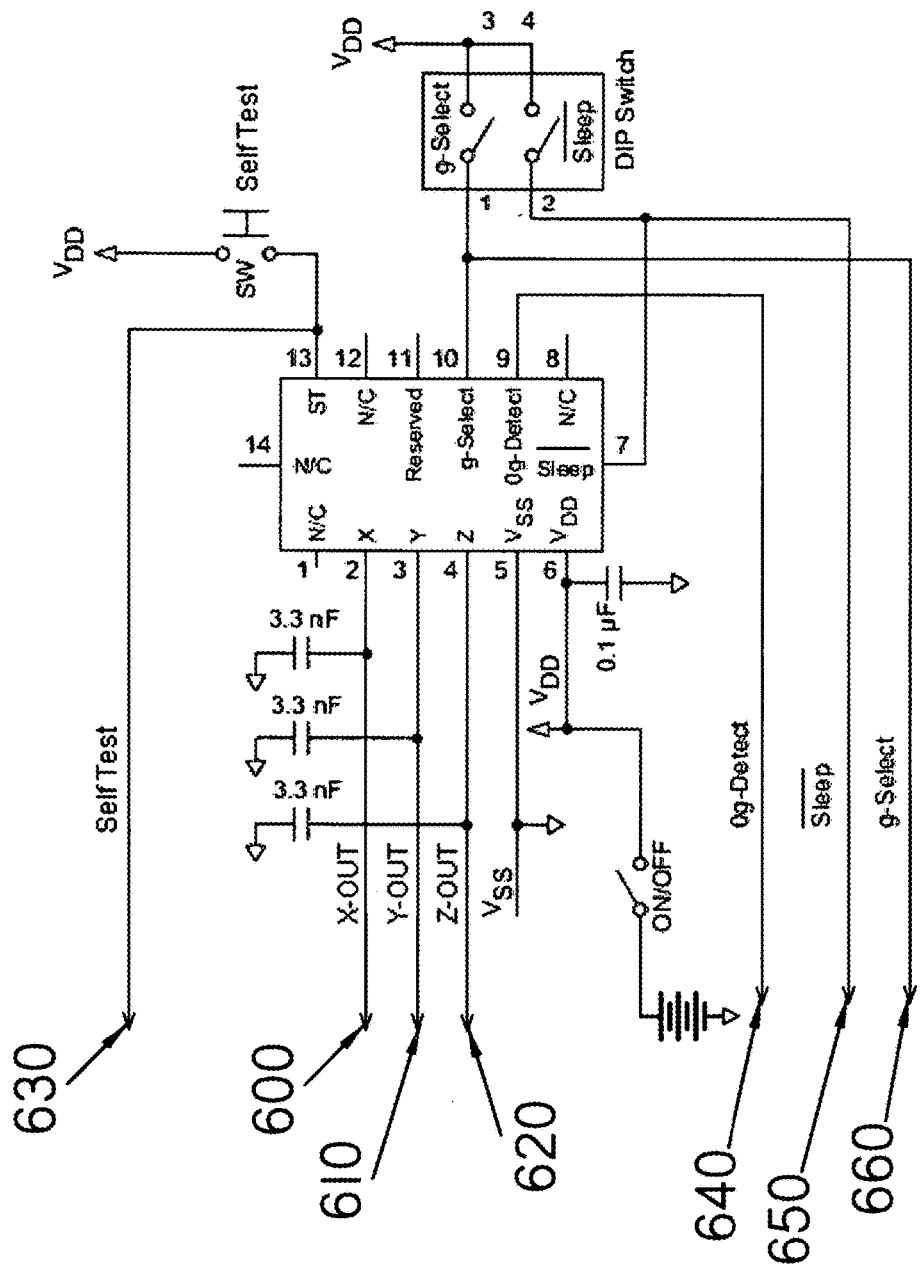

FIG. 5 is a preferred embodiment of the disclosed invention spatial attitude sensor, which is part of the sensor package in FIG. 1 identified as 230. The spatial sensor is used to determine if a line break or severing has transpired, due to a sudden associated physical change in line monitor orientation as contrasted with a prior steady-state condition. A sudden transient in physical orientation in space of the sensor package for the line monitor assembly invention will result in a signal being produced at one or all of the X, Y, or Z accelerometer outputs 600, 610, and 620. The axis outputs 600, 610, and 620 are preferably coupled capacitively into a comparator circuit, which triggers a state condition change registered by the monitor microcontroller depicted in FIG. 1 as 150. Control functions in the preferred embodiment of the spatial orientation accelerometer sensor include a power-up self test 630, a 0-g reference 640 for establishing an initial condition, a power saving sleep state 650 control, and a g-level 660 sensitivity control.

DETAILED DESCRIPTION OF DISCLOSED INVENTION

Lab tests were conducted to ascertain the problem of detecting a downed power line that could be easily revealed to the public. We used a 14.4 kV power transformer to simulate a high potential residential line that could provide power to a distribution transformer. One side of the line was grounded (using a rod) and the remaining terminal affixed to a cable in close proximity to the ground surface simulating a downed power line. The output current was approximately than 1 amp. When energized, the line in close proximity to the ground yielded significant arcing, producing a plasma that began to melt the local concrete. Ultraviolet and infrared light were emitted, and broadband RF interference was readily observed on our spectrum analyzer. Ultrasonic emissions from the arc could easily be detected hundreds of feet away, as could AM radio frequency emissions using a direction loop antenna connected to an oscilloscope or audibly using a simple diode/RC circuit for demodulation of the high frequency envelope.

When we lifted one leg of the transformer above the ground supported on an insulating box, there was no arcing, but there was still a low-level acoustical emission due to corona discharges. Some current flow was apparent upon activation of the transformer primary and was accompanied by physical movement of the cables resulting from the induced B field. Acoustical emissions were observed in the ultrasonic range, and some infrared signature could be detected over time. The infrared would no doubt be magnified with a true transmission line carrying hundreds of amperes, while our setup was limited to approximately 800 milliamps. Radio frequency emissions were always accompanied by the acoustical detection of any corona, as is to be expected. We constructed an ultrasonic downed power line detector using a Panasonic ultrasonic transducer with a center resonant frequency of 40 KHz. This transducer was buffered by two LM318 op amps in series and coupled to an RMS-DC converter to demodulate the signal into the audible spectra. An RMS-DC converter performs the same envelope detection that a rectifier and resistor capacitor (RC) network achieves in a typical AM radio's detector stage. We also detected radio frequency interference (RFI) from both our simulated downed power line using a simple loop antenna and standard AM radio envelope detection. Arcing generates broadband radio noise from one kilohertz to over 1000 Megahertz. Above 50 Mhz, the magnitude of arcing RFI drops off.

Power lines can produce significant RF emissions in the event of a downed cable. The emission sources are almost always due to a line fault, spike, arc, or coronal formation. Because of some of the emissions possible in a transmission line, a telemetry function back to the utility that uses the transmission line itself as carrier was rejected in lieu of a spread spectrum approach—not to mention the fact that a downed wire could be physically disconnected from the source and be incapable of sending information. Some other sources of radio interference from power lines include:

Incidental emitters: Most interference complaints from power-company equipment results from an incidental emitter. Incidental emitters don't intentionally generate radio energy, but incidentally does so as a result of its operation. Examples of incidental emitters include electric motors and sparking power-line hardware.

Unintentional emitters: These may be found in some power-company equipment. Unintentional emitters utilize an internal radio signal, but do not intentionally radiate or transmit it. Examples include some types of "switch-mode" power supplies and microprocessors used in some power-company equipment. Unintentional emitters have specific limits on radiated and conducted emissions.

Intentional emitters: These are transmitters that intentionally radiate RF. In general, they are not found in power company equipment, although some remote-reading usage meters may use intentional emitters.

In one embodiment of the disclosed invention, radio frequency detection may be combined with ultrasonic acoustical emission detection. Ultrasonic emissions are highly directional and can be used to help pinpoint possible points of high voltage arcing due to a failed power line.

After consideration of the various options for the disclosed transmission line status indicator invention, we had to envision how it would be best to deploy such devices. We knew we could detect a power line arc or corona acoustically, visually, thermally, and wirelessly from RF emissions from a distance; however, not all downed lines may be arcing. If the voltage is low, but current high, such as would be the case for a 120-volt leg from a distribution transformer, there could still be a significant hazard present. The objective for an ideal line sensor would be to identify a downed line regardless of the voltage, current, energy emissions, or noise on the line. Indeed, in any power transmission line, as thousands of utility customers add/remove loads onto a transmission line, significant noise can be present from inductive, capacitive, and even transitory short circuit loads. Transmitting a signal from a line detector through the grid across possibly multiple transformers amongst background noise to a command center can be challenging. Indeed, a utility may wish to limit the spectral bandwidth on their transmission lines to avoid spurious emission or interfering with internal equipment data exchange. So, how best to detect a line anomaly and report a suspected downed wire condition back to a central station, while protecting the public?

One aspect of the disclosed invention is the use of a smart phone in conjunction with a smart line sensor. Addressing each component of the invention, we will consider the latter first. The first aspect of the invention is an inductively coupled line sensor that can 'clamshell' around standard power lines. The inductive sensor would contain a transformer/coil to inductively provide device power, which is rectified and filtered to a low voltage DC supply. Relevant precedents include inductive 'clamp' ammeters and some remote cameras and other monitors. When a power line is undamaged and connected in a circuit with a load, there is of course an associated magnetic field. If the load disappears, the magnetic field strength also disappears, as there is no longer any current flow. However, the mere presence of a conductor in close proximity to an active line will still detect a 60 Hz signal. Thus, the disclosed invention includes a circuit that can be triggered by the loss of a B field but yet still detects a 60-Hz electric field, we know the line is still a danger to the public. The loss of both the magnetic and electric field reveals a dead line. The preferred embodiment contains a battery backup, solar cell for battery charging, and a micro-controller that is configured to log transient line information, the date and time when the line break occurred, and the means to display line condition audibly and visually.

Transmission of line status back to a central office is preferably effected using low power spread-spectrum technology. Use of spread spectrum allows for low power consumption commensurate with FCC rules yet relatively long distance communication between line status indicators. An added embodiment of the disclosed invention line monitors is that multiple units can serve as 'nodes', which pick up and shuttle line indicator status information in a 'bucket-brigade' fashion, each line detector serving as part of a larger telemetry chain. The benefit of this approach is that such a system is immune to line noise, line transformers in the network, and does not rely on the presence of local cellular towers as repeaters.

In the preferred embodiment, visual indication is ideally provided using high intensity, low powered LEDs. The LEDs can be Red, Yellow, or Green depending on the level of potential hazard, mimicking of course an ordinary traffic light. Another embodiment is an aural warning that can be achieved using low powered piezo-electric transducers such as the chirps found in smoke detector low battery warnings. The line monitor chip duty cycle can be set to prolong sensor battery life for days or weeks yet provide long-range warning. The combination of flashing visual and pulsing audible alarms even in the absence of line connection would serve to protect bystanders and yet assist line crews on the condition of a specific line in question.

The next aspect of the disclosed invention for a line monitor system includes the use of a smart phone. The iPhone has a magnetometer, a magneto-resistive permalloy sensor, the AN-203 chip produced by Honeywell. When we approached our 14.4 kV simulated downed line; we were able to detect a significant change in magnetometer readings. As such, one embodiment of the disclosed invention is a smart phone app or software application that could employ a fusion of sensory inputs from a smart phone to detect a live power line. Such a fusion of technologies may use an external phone interface that contains an ultrasonic transducer (the frequency range of the iPhone mic is unsuited for this) and a PC board (PCB) board directional RF antenna. Such antennas are now routinely employed on circuit boards using fractal analysis.

But what if we want to use a smart phone without any external attachments? One embodiment of the disclosed invention would be a fusion of phone app and the stand-alone line sensor. The visual indicator for our line sensor was already described as being an LED. This type of visual device can be strobed to provide a remote data link from the power line to the smart phone camera. The benefit here is that we can use the same detection spectra of the built-in charge coupled device (CCD) sensor and extract a data stream of information transmitted by the line monitor regarding the line ID number, voltage, date and time of interruption, and much more. And because the data rate will be faster than the human eye can sense, the LED will appear to be illuminated continuously. A cell phone with such an app could also use the cellular network to transfer this line information to a central office. The app could even provide GPS information to line crews as to the proximity of known lines with trouble. The beauty of this dual approach, stand-alone line monitor and smart phone inter-connectivity capability, is that neither is dependent on the other. The stand alone line sensor can function without the phone, and the phone can provide data about the line. An app can also be downloaded in a matter of seconds to a first responder and can be upgraded dynamically as new data emerges about the potential area line threats. To test part of this concept, we created a simple magnetometer app, which did reveal our simulated line hazard!

iPhone Camera Telemetry Capability—IR LED Detection Example

If one has an iPhone, the fact that the built-in CCD camera can detect partly in the IR spectrum for remote LED monitoring can easily be demonstrated. The ability of a smart phone to detect infrared emissions can be tested as follows; using an iPhone, start the Camera app, and point the camera at the LED toward a TV remote control. As you look at the iPhone screen, press any button on the remote. Although the remote is transmitting a bright infrared light beam, one cannot see it with your eye because obviously your eye is not sensitive to light in the frequency of infrared (around 940 nm for a remote control). The iPhone's main camera cannot detect infrared light, because Apple added a filter over the lens that blocks out infrared light, so the infrared light cannot be seen on the screen. Now press the "switch cameras" icon in the upper right corner of the iPhone's Camera app so that the FaceTime camera's view is being displayed on the screen. You will see yourself on the screen. Now point the FaceTime camera at the LED end of your TV remote control and press a button on the remote. Your eye can't see the IR light, but now you will see the IR light appear in the viewfinder as a bright white light. It turns out that the FaceTime camera on an iPhone does NOT have IR filtering on it!

Detail of Proposed Stand-Alone Line Monitoring Nodes

In yet another embodiment of the disclosed invention, for a typical 3-phase transmission line, a single transmission line monitor is clamped onto each of the three (or more) lines. The "trio" of monitors would need to be placed throughout the transmission line grid at intervals of short distance for congested, urban areas, of about one trio every half mile. For more rural areas, a longer interval could be used, of one trio every one or two miles. Because the proposed transmission line monitors are capable of being "clamped" onto a live transmission line, there is no need to have a hard wire connection to the transmission line. The desirability of this is that a single lineman can quickly and effectively connect many of these devices in a single shift.

The device is constructed to include two clamping clips that lock the transmission monitor around the transmission line. A lineman can thus clamp one of the transmission line monitors in literally seconds. Once clamped on, the transmission line monitor will immediately start charging the internal rechargeable battery, and will indicate its operational status on the unit's LED's (light emitting diodes).

With the advances in LED technology available today, a single led can be highly visible from many yards away, even in daylight. Aside from providing a simple visual indication of the transmission line monitors status, the LED's can provide communication to a remote optical detector, such as a cell phone. The encoded data will provide information such as how long the "event" has been active, what the "event" was that occurred, and whether there is any current flowing through the transmission line. The LED can also optically encode whether there is any voltage present on the transmission line.

The transmission line monitor contains a rechargeable battery that will provide internal power in the case of a downed line. The theory behind the operation of the transmission monitor as innovative, but well grounded in theory. When current is flowing through a transmission line, a coil of wire wrapped around the transmission line will produce an electrical current. This induced current powers the transmission line monitor. Because the circuitry is highly efficient and low power, very little current is required to power it. The required current is estimated at approximately 5 milliamps in standby, 30-50 mA in active alert mode. The wire coil-core is similar to the clampable cylindrical opening, such as what is used by many AC wireless current sensors.

In one version of the proposed device, when the transmission monitors are monitoring a current flow and detecting an electric field, they will indicate a "Normal" status by illuminating the green LED. If there is a problem with the transmission line monitor or an intermittent abnormal condition on the transmission line, the yellow LED will illuminate. The microcontroller and LED drive circuit is also capable of encoding information optically, which can be interpreted by a cell phone running an appropriate App. A red LED will illuminate when there is a sudden loss of the B (magnetic) field (no current/load) along with a time matched physical drop in the transmission line as detected by a MEMS accelerometer chip (Analog Devices, Norwood, Mass.), There may also be a loss of the electric field. A situation can arise where there is a break in one of the three transmission lines, where the load side is without power, while the source side is still live or "hot", but no current (or minimal current) is flowing through the transmission line. In this case, the transmission line monitor that is on the source side will indicate a red LED, with encoded optical data reporting loss of current, but still showing a live or "hot" transmission line. An audible alarm will be sounded under this condition. The activation of the audible alarm can be over-ridden by the utility via RF telemetry or optical communication with the line monitor. By rapidly comparing transmission line monitors that are spaced some distance apart, an indication can be given as to the approximate location of the break or downed line. Due to the minimal power required to operate the transmission line monitor, the transmission monitor can be constructed as a small footprint device, preferably 4 to 6 inches long, by 3 inches wide by 4 inches high, depending on the level of functionality desired.

It has long been established that LED's are highly efficient sources of illumination, but what is not as widely known is that the same LED can be used in a reciprocal manner, they can also sense light! Forrest M. Mims III made the discovery of this "dual use" of LED's as light sensors over a decade ago. Forrest wrote a paper for Applied Optics magazine in 1992, entitled "*Sun Photometer with Light-Emitting Diodes as Spectrally Selective Detectors*". In this paper Forrest describes how to use LED's in a reciprocal role as a narrow band light sensor. The LED functions as a narrow band, wavelength specific light detector. In traditional Sun photometers, a light detector such as a wide optical bandwidth Photo-Diode is used in conjunction with a narrow band optical filter to determine the intensity of a specific wavelength of light. In fact Forrest M. Mims III was contracted by Radio Shack® to develop a small portable multi-wavelength "Sun & Sky Monitoring Station". The "*Sun & Sky Monitoring Station*" allows the user to collect very professional data related to Solar and Atmospheric conditions. In the preferred embodiment of the disclosed invention, the indicator LED's are being used in a dual role as a source of illumination and as a wavelength specific detector. Since the LED cannot do both things at the exact same time, the microcontroller must periodically place the indicating LED in a reversed bias condition. This can be achieved by utilizing a relay to change the polarity of the LED and connect it to the input of an operational amplifier (op-amp) circuit. Most microcontrollers have basic I/O (Input/Output) connections that can be configured as an input sensing pin or an output pin. When configured as an output pin, the pin can be placed in a high state (+5 volts or +3.3 volts in the case of lower voltage microcontrollers) or a low state (0 volts). When the microcontroller I/O pin is configured as an input, there is usually an internal pull up resistor that is switched in by the microcontroller. If the microcontroller's I/O pin senses a +5V level, it will read this as a logic one or high logic state. If the microcontroller's I/O pin senses a 0 V level, it will read this as a logic zero or low logic state. When the microcontroller is placed in the "listen" state, it will place one of the specific color LED's in a reversed bias state, while also connecting the LED to the input of an op-amp. The output of the op-amp will need to be connected to a comparator as the intensity of the incident light on the reversed bias LED will not be equal to +5 volts (maximum incident light) or 0 volts (minimum or no incident light. The comparator will have a low threshold voltage in which any time this threshold is exceeded, the comparator will output a logic high or +5 volts. This will be read in by the microcontroller, and the duration of the time the pin is at logic high will correspond to a "bit" or portion of a serial command. The microcontroller will have a pre-programmed set of specific commands that it will expect to read from an external source, such as a utility worker with a smartphone and a proprietary App. To facilitate this communication, most microcontrollers contain a special device called a UART (Universal Asynchronous Receiver Transmitter).

Asynchronous transmission allows data to be transmitted without the sender having to send a clock signal to the receiver. Instead, the sender and receiver must agree on timing parameters in advance and special bits are added to each word which are used to synchronize the sending and receiving units.

When a word is given to the UART for Asynchronous transmissions, a bit called the "Start Bit" is added to the beginning of each word that is to be transmitted. The Start Bit is used to alert the receiver that a word of data is about to be sent, and to force the clock in the receiver into synchronization with the clock in the transmitter. After the Start Bit, the individual bits of the word of data are sent, with the Least Significant Bit (LSB) being sent first. Each bit in the transmission is transmitted for exactly the same amount of time as all of the other bits, and the receiver "looks" at the wire at approximately halfway through the period assigned to each bit to determine if the bit is a 1 or a 0. For example, if it takes two seconds to send each bit, the receiver will examine the signal to determine if it is a 1 or a 0 after one second has passed, then it will wait two seconds and then examine the value of the next bit, and so on.

The sender does not know when the receiver has "looked" at the value of the bit. The sender only knows when the clock says to begin transmitting the next bit of the word. When the entire data word has been sent, the transmitter may add a Parity Bit that the transmitter generates. The Parity Bit may be used by the receiver to perform simple error checking. Then at least one Stop Bit is sent by the transmitter.

When the receiver has received all of the bits in the data word, it may check for the Parity Bits (both sender and receiver must agree on whether a Parity Bit is to be used), and then the receiver looks for a Stop Bit. If the Stop Bit does not appear when it is supposed to, the UART considers the entire word to be garbled and will report a Framing Error to the host processor when the data word is read. The usual cause of a Framing Error is that the sender and receiver clocks were not running at the same speed, or that the signal was interrupted.

Regardless of whether the data was received correctly or not, the UART automatically discards the Start, Parity and Stop bits. If the sender and receiver are configured identically, these bits are not passed to the host.

If another word is ready for transmission, the Start Bit for the new word can be sent as soon as the Stop Bit for the previous word has been sent.

Because asynchronous data is "self synchronizing", if there is no data to transmit, the transmission line can be idle.

Both the microcontroller and the external communication device must know ahead of time what the correct communication parameters are for this to work. Typical parameters when programming a UART are the number of bits in a word, the number of stop bits used, the parity of the word, and the BAUD rate.

Baud rate is a measurement of transmission speed in asynchronous communication. In the preferred embodiment of the disclosed invention, the BAUD rate will not be that high, typically 9600 BAUD. With a higher BAUD rate, there is a greater chance for error due to any movement from either the handheld smartphone, the power line sensor, or both. If the BAUD rate is too low, like 300 BAUD, then the operator will need to remain at the scene longer due to the increased amount of time required to send and receive data.

Typical data sent to the power line monitor will be a general query, asking the device to report its status to the remote smartphone. The status will indicate if the power line monitor is operating normally, or if there is a loss of a B field or E field, what direction the current is flowing in, if there has been any violent spatial changes indicative of a break or high winds, and determination as to the power line rechargeable batteries status.

Some consumer appliance manufacturers have developed appliances that have the ability to be remotely controlled by a utility company, such as switching an air conditioner to a low power mode during times of peak power demand in the summer. Based on the fact that more and more digital or analog information may be superimposed onto transmission lines, it is advisable to have a system that does not add to the amount of possible line "chatter". With the use of optically encoded data, a transmission monitor could communicate significant amounts of data to a cell phone equipped with a suitable App while remaining at a safe distance. An optical sensor could provide for two-way communication with the transmission line monitor while allowing the user to remain a safe distance away from the transmission line. An alternative would be using the Bluetooth capability of many smart phones. An evaluation of optical or Bluetooth line interrogation of the line monitor will be part of the proposed Phase I study. Consideration will also be given to the use of a GPS module. Such modules produced by Texas Instruments and Linux Technologies can provide a spatial displacement capability to the power line monitor. If a line breaks, the change in sensor orientation can be detected and transmitted to the utility. Another benefit would be displacement data in high winds for transmission towers.

Power Line Monitor Components

These stand-alone units will be designed to easily clamp around a power line, and will derive power inductively. The units will have battery backup, and contain a microcontroller along with analog detection circuitry to determine the presence/loss of a load and an electric field. The status, date and time, will be able to be transmitted using a spread spectrum module to a personal computer (PC). In addition, loss of load/connection will be accompanied by visual LED indication and a piezo audible alarm. The serial data pulse train will also be part of the LED cycle.

The Disclosed Invention Operation in Summation

Referring to the block diagram in FIG. 1 of the preferred embodiment system, which includes a split ferrite core 280 that can be enclosed like a clamshell around a transmission line 100 through which there is an alternating current 110 flowing. Inductive coil windings 120 derive both an alternating voltage signal which is filtered 130 preferably using a series resistor and a capacitor across the line. The output of the inductive coil 120 is also connected to a power supply module 140 which preferably contains a half wave or full wave diode rectifier followed by a series resistor and shunt capacitance sufficient to provide a direct current to rechargeable battery 170. The filtered electrical signal from 130 is connected to an RMS to DC converter such as an Analog Devices (Norwood, Mass.) AD536 or AD637 device. The signal from the RMS-DC Converter 150 is fed 180 into a microcontroller 160 which is programmed to look for several electrical state conditions as determined by a connection 220 to sensor package 230. The sensor package 230, RMS Converter 150, Microcontroller 160, and communication module 240 all derive operating power from connection 200 connected to the power supply 140. The sensor package 230 includes input options such as electrical field detection and angular, shock, or motion detection. In one embodiment, an accelerometer MEMS device such as the Analog Devices ADXL345, a three axis device, is capacitively coupled to a comparator circuit, such that any sudden change in spatial attitude in any axis will produce a transient alternating current signal that can be expressed through the capacitive coupling and into a comparator circuit and sampled against a predetermined reference voltage. A signal that exceeds the preset reference will be determined to indicate a sudden change in spatial orientation of a power transmission line as associated with a line break and subsequent drop of the line toward the ground. The microcontroller 160 is preferably programmed to detect the following state conditions;

7. presence of a B and E field, and no spatial change in sensor position;
8. loss of B field and presence of E field, no spatial change
9. loss of B and E field, sudden spatial change
10. loss of B field and presence of E field, sudden spatial change
11. transient loss or presence of B & E fields, spatial change, intermittent spikes
12. presence of B and E field, sudden spatial change Transient loss or presence of B & E fields, spatial change, intermittent spikes produce a signal 190 from the microcontroller 160 to be delivered to the communication module 240. The communication module contains internal logic, which activates visual LED status lamps such as preferably safe or green 250, potential hazard or yellow 260, and danger or red 270. Additional LED lamps may be added such as infrared emitting devices that can be strobed in a serial manner obvious to those skilled in the art to provide power line module status condition data derived from the microcontroller 160 and ground infrared receivers. The communication module 240 in a preferred embodiment includes an acoustic alarm, such as a piezo buzzer to warn pedestrians of a power line hazard. In addition, in the preferred embodiment, the communications module is configured to provide RF communication with the power utility, cellular devices such as a smart phone, and simplex or duplex communication with other power line monitors. The microcontroller is connected to the RMS converter 150, sensor package 230, and communication module 240 by a data bus 210.

The above description shows that the communications module 240 is not comprised solely of a piezo buzzer. Reference to FIG. shows that the communications module 240 is coupled to receive discrete outputs from SENSOR Package 230 and then functions as a means coupled to provide output discrete alarm signals identifying a defect to a communications link, the communications link configured to provide an RF communication of the detected defect using a cellular device capable of simplex or duplex communication to a responsible service center, or power utility.

Effective Power Line Monitor Invention Key Innovations

First and foremost, the disclosed invention provides for a power line detector that can be easily affixed to any power line; derives operating power from the line; captures B field and E field data; and provide visual and/or audible alerts when the line is interrupted and/or arcs or produces a corona indicative of a downed wire. Telemetry capability in the form of a spread spectrum transmission is provided. Next, is the inclusion of a Smartphone application program that can detect magnetic field anomalies, and which can interface with the power line detector using Bluetooth, optical or other means to capture line status data.

The objectives solved by the disclosed invention include the development of a low cost, light weight, self-energized power utility cable monitor that is capable of alerting personnel in the immediate area and at a central utility facility about a line break. Another embodiment of the disclosed invention is to include a voice alert warning pedestrians to "Stay Away" from a downed line. Broken yet active power lines present an immediate threat to nearby individuals, and the lack of information concerning line failure during a storm or other event that results in a downed line can delay system repair. In addition, first responders can be compromised in rescuing individuals near a downed line for fear the line may present a shock hazard. The disclosed invention is designed to address the problem at hand, is a transmission line sensor assembly that can be quickly clamped around the power line. The device will contain the equivalent of a 'clamp-on' ammeter with a non-ferrous core to mitigate $I^2R$ losses. This ammeter circuit detects the presence of a load as a consequence of current flow, and analyzes line transients that may occur due to arcing or corona discharges. An additional coil located adjacent to the line serves as an air gap transformer to record the electric field. The unit derives operational energy from the line itself inductively. Signals from both B field and E field coils will be amplified and applied to an RMS-DC converter. The base line output of the converter will be compared to a user adjustable reference and using a comparator circuit, toggle a visual (LED) and aural (piezo buzzer) alert in the event of a line failure. A line failure may be determined using a fusion of sensor data to the comparator circuit. Using an accelerometer chip, such as the Analog Devices 3-Axis ADXL MEMS devices, the sudden release and drop of a power line can be determined. The presence of an electric field even in the absence of corona or arcing would signify an alert condition. Reporting of line status will be accomplished using spread spectrum technology derived from off-the-shelf transponder modules. Each line monitor will have the capability of receiving and forwarding a line monitor alert bucket-brigade style to a central office or from a cell phone equipped with cell phone software. Spread spectrum was chosen because transmission of data packets on the transmission line itself may be difficult due to line noise associated with downed cables (corona/arcing) and reactive attenuation of RF signals through transformers. A flashing red warning LED can appear to the eye constant, but actually be cycled with a data bit stream received by a Smart phone. The transmission line can detect for the presence of an improperly connected electrical generator during a power failure. If someone connects a home generator to a fuse box and forgets to disconnect the main breaker, power can be back fed into the lines that can injure or kill a lineman.

Inductive Pickup

For our B field detection pickup, ferrous materials are not preferable. At present, they are heavy, have high eddy current losses, and are also non-linear; the disclosed invention uses a simple air core inductor or a non-ferrous inductor into a circuit, and the impedance is predictable as $Z=j\omega L$.

The use of a paramagnetic may have some "amplification" of magnetic signal; diamagnetic materials would have the opposite effect. Copper is not very paramagnetic, and so the disclosed invention uses a clamp design using this material. For electric field detection, the invention preferably employs a simple coil placed next to the line.

Because transmission lines are extremely noisy (before distribution transformers) we need to obtain a uniform value of the B and E fields. To accomplish this, in the preferred embodiment employs an averaging the signal using an RMS-DC converter (Analog Devices).

Also, in the preferred embodiment, the logic design takes into consideration several possible transmission line states;
1. presence of a B and E field, and no spatial change in sensor position;
2. loss of B field and presence of E field, no spatial change
3. loss of B and E field, sudden spatial change
4. loss of B field and presence of E field, sudden spatial change
5. Transient loss or presence of B & E fields, spatial change, intermittent spikes
6. presence of B and E field, sudden spatial change Spatial change indicative of a sensor dropping due to a line break is detected using an Analog Devices MEMS accelerometer. A unit with a span of only a few g's is sufficient, such as the ADXL103.

GLOSSARY OF TERMS

B—:Field: A magnetic field
E—Field: An electric field
LED: Light Emitting Diode

Diamagnetic: A material that has a weak, negative susceptibility to magnetic fields. Diamagnetic materials are slightly repelled by a magnetic field and the material does not retain the magnetic properties when the external field is removed. In diamagnetic materials all the electrons are paired so there is no permanent net magnetic moment per atom. Diamagnetic properties arise from the realignment of the electron paths under the influence of an external magnetic field. Most elements in the periodic table, including copper, silver, and gold, are diamagnetic.

Paramagnetic: A material that has a small, positive susceptibility to magnetic fields. These materials are slightly attracted by a magnetic field and the material does not retain the magnetic properties when the external field is removed. Paramagnetic properties are due to the presence of some unpaired electrons, and from the realignment of the electron paths caused by the external magnetic field. Paramagnetic materials include magnesium, molybdenum, lithium, and tantalum.

RF: Radio Frequency energy

Spatial Change: A deviation in physical orientation in space with respect to a predetermined initial condition. For the purposes of this disclosure, the output of an accelerometer or tilt sensor is nulled or cancelled out when a transmission line sensor clamped to a power transmission line is in a preferably horizontal position. A sudden break in a transmission line would subject the line sensor to traverse through physical space, typically an arc, resulting in the production of an electrical signal that corresponds to the rate and/or angle and/or g-force experienced by the sensor package. The spatial sensor is used to determine if a line break or severing has transpired, due to a sudden associated physical change in line monitor orientation as contrasted with a prior steady-state condition. A sudden transient in physical orientation in space of the sensor package for the line monitor assembly invention will result in a signal being produced at one or all of the X, Y, or Z accelerometer outputs 600, 610, and 620 in FIG. 5. The axis outputs 600, 610, and 620 in FIG. 5 are preferably coupled capacitively into a comparator circuit, which triggers a state condition change registered by the monitor microcontroller depicted in FIG. 1 as 150. Control functions in the preferred embodiment of the spatial orientation accelerometer sensor include a power-up self test 630, a 0-g reference 640 for establishing an initial condition, a power saving sleep state 650 control, and a g-level 660 sensitivity control.

What is claimed is:
1. A system for the standoff detection of a, power line detect comprising:
    a ferrite core having a window,
    a first power line to be monitored passing through the window and forming a first winding,
    a second winding passing through the window and having a first and second terminal,
    a low pass filter coupled to the second winding and outputting a filtered electrical signal,
    a bridge rectifier coupled to the filtered electrical signal to provide charging current for a backup battery 1 and to provide a filtered bus voltage source,
    an RMS to DC converter having a first input connected to the bridge rectifier input terminal, and a second input connected to the bridge rectifier second input terminal, the signal at the bridge rectifier first input terminal and second input terminal characterizing a filtered electrical signal coupled to the RMS to DC converter first and second inputs, the RMS to DC converter processing the filtered electrical signal to provide a DC signal, a micro controller having a first and second input coupled to receive the DC signal, the micro controller being programmed to identify a plurality of electrical states and to provide an output for each electrical state identified,
    a sensor package containing a plurality of sensors selected from a group comprising:
    an electrical field detector;
    an angular, shock, or motion detector;
    a micro electro-mechanical system (MEMS) accelerometer; and
    a three axis spatial attitude detector;
    the sensor package is characterized to provide discrete outputs to a communication module, the communications module is a means coupled to receive the discrete outputs from the sensor package for providing output discrete alarm signals identifying the power line defect to a communications link, the communications link being configured to provide an RF communication of the defect using a device capable of simplex or duplex communication to a responsible service center, or power utility, wherein the window is further characterized to receive a second power line carrying a return current from the first power line.

2. The system for the standoff detection of the power line defect of claim 1 further comprising: a solar array for producing the charging current for a backup battery.

3. The system for the standoff detection of a power line defect of claim 1 wherein the communication module means is coupled to receive the discrete outputs from the sensor package for providing output discrete alarm signals identifying the defect to a communications link is further characterized to provide alert signals to pedestrians selected from the set comprising:
 optical alerts,
 acoustical alerts, and
 voice synthesis for spoken warnings to area pedestrians.

4. The system for the standoff detection of a power line defect of claim 1 wherein the ferrite core is further characterized as being formed to have two halves that are joined around the power line to be monitored.

5. The system for the standoff detection of a power line defect of claim 1 wherein the micro controller is programmed to identify states selected from the fp11 owing set of states:
 a. presence of an electromagnetic (B) and an electric (E) field, and no spatial change in sensor position;
 b. loss of B field and presence of E field, no spatial change
 c. loss of B and E field, due to a sudden spatial change
 d. loss of B field and presence of E field, due to a sudden spatial change,
 e. a transient loss or presence of B & E fields, due to a sudden spatial change or due to intermittent spikes.

6. A system for the standoff detection of a power line defect comprising:
 a ferrite core having a window,
 a first power line to be monitored passing through the window and forming a first winding, a second winding passing through the window and having a first and second terminal,
 a series resistor having a first end, and a second end, the series resistor first end being connected to the second winding first terminal,
 a shunt capacitor having a first end and a second end, the shunt capacitor first end being connected to the series resistor second end, the capacitor second end being connected to the second winding second terminal,
 a bridge rectifier having a first input and second input terminal, a positive output terminal and a negative output terminal, the first input terminal being connected to the series resistor second end, the bridge rectifier second input terminal being connected to the capacitor second end,
 a low pass filter formed by a second resistor having a first and second end and a second capacitor having a first and second end, the second resistor first end being connected to the bridge rectifier positive output terminal, the second capacitor first end being connected to the second resistor second end, the second capacitor second end being connected to the bridge rectifier negative output terminal,
 an RMS to DC converter having a first input connected to the bridge rectifier first input and a second input connected to the bridge rectifier second input, the signal at the bridge rectifier first input terminal and second input terminal being characterized as a filtered electrical signal being coupled to the RMS to DC converter inputs, the RMS to DC converter processing the filtered electrical signal to provide a DC signal,
 a micro controller having a first and second input coupled to receive the DC signal, the micro controller being programmed to identify a plurality of electrical states and to provide an output for each electrical state identified, a sensor package containing a plurality of sensors selected from a group comprising;
 an electrical field detector;
 an angular, shock, or motion detector;
 an MEMS accelerometer; and
 a three axis spatial attitude detector;
 the sensor package is characterized to provide discrete outputs to communication module, the communications module is a means coupled to receive the discrete outputs from the sensor package for providing output discrete alarm signals identifying the power line defect to a communications link, the communications link being configured to provide an RF communication of the defect using a cellular device capable of simplex or duplex communication to a responsible service center, or power utility,
 wherein the window is further characterized to receive a second power line in addition to the first power line, the second power line carrying a return current from the first power line.

7. The system for the standoff detection of power line defect of claim 6 further comprising:
 a solar array for producing the charging current for a backup battery.

8. The system for the standoff detection of a power line defect of claim 6 wherein the communications module means coupled to receive the discrete outputs from the sensor package for providing output discrete alarm signals identifying the power line defect to a communications link, the defect to a communications link is further characterized to provide alert signals to pedestrians selected from the set comprising:
 optical alerts,
 acoustical alerts, and
 voice synthesis for spoken warnings to area pedestrians.

* * * * *